United States Patent
Liebenow

(10) Patent No.: US 7,562,537 B2
(45) Date of Patent: Jul. 21, 2009

(54) METHOD OF DETERMINING COOLING SYSTEM EFFECTIVENESS

(75) Inventor: Frank Liebenow, Jefferson, SD (US)

(73) Assignee: Gateway, Inc., Poway, CA (US)

( * ) Notice: Subject to any disclaimer, the term of this patent is extended or adjusted under 35 U.S.C. 154(b) by 440 days.

(21) Appl. No.: 11/003,835

(22) Filed: Dec. 3, 2004

(65) Prior Publication Data
US 2006/0117779 A1 Jun. 8, 2006

(51) Int. Cl.
F25D 23/12 (2006.01)
F25B 49/00 (2006.01)
G06F 1/00 (2006.01)

(52) U.S. Cl. .......................... 62/259.2; 62/125; 62/129; 713/500

(58) Field of Classification Search ............... 62/129, 62/130, 178, 186, 259.2, 125, 126, 127, 128; 236/49.3; 713/500

See application file for complete search history.

(56) References Cited

U.S. PATENT DOCUMENTS

| | | | |
|---|---|---|---|
| 4,936,105 A * | 6/1990 | Takechi et al. | 62/129 |
| 5,574,667 A * | 11/1996 | Dinh et al. | 700/300 |
| 5,631,852 A * | 5/1997 | Chen | 702/130 |
| 5,726,874 A * | 3/1998 | Liang | 363/141 |
| 5,790,430 A * | 8/1998 | Steiert | 340/648 |
| 6,735,499 B2 * | 5/2004 | Ohki et al. | 700/299 |
| 6,822,861 B2 * | 11/2004 | Meir | 361/695 |
| 2005/0103873 A1 * | 5/2005 | Cheng | 236/49.3 |

FOREIGN PATENT DOCUMENTS

JP 2003294336 A * 10/2003

* cited by examiner

Primary Examiner—Chen-Wen Jiang
(74) Attorney, Agent, or Firm—Pearne & Gordon LLP

(57) ABSTRACT

A method and apparatus is disclosed for detecting the ineffectiveness or failure of a fan that is used to cool an electronic device. The method and apparatus use temperatures measured before and after the fan is energized to determine if the temperature trend is affected by the operation of the fan. If the trend is not substantially affected by the operation of the fan, it is determined that the fan is not operating effectively and the user may be notified.

19 Claims, 5 Drawing Sheets

METHOD OF DETERMINING COOLING SYSTEM EFFECTIVENESS

FIELD OF THE INVENTION

The present invention generally relates to the field of cooling electronic equipment using a fan, and more particularly is directed to a new system for detecting when the cooling fan of an electronic device is not operating properly.

BACKGROUND OF THE INVENTION

During operation, electronic devices typically generate heat. Often, this heat is not only unwanted, but may lead to premature failure of the electronic device. Many electronic devices utilize heat sinks, fans (or a combination of the two) or other cooling systems in order to cool the device and reduce the possibility of a premature failure. Unfortunately for many electronic devices, the cooling system, or fan, itself is one of the components that is most prone to failure because it involves a moving device that utilizes, for example, bearings that sometimes freeze in place or fan blades that may collect so much dust that they can no longer turn. Furthermore, even when the cooling system is electrically and mechanically operational, other issues may prevent cooling effectiveness, including blockage of air passages. An example of such an electronic device is a personal computer. The personal computer has several components that produce so much heat that, without active cooling, the temperatures of these components would reach a point where either the device fails, or an internal mechanism shuts down the device until the temperature falls into a suitable operational range for the component.

In many applications, the electronic device is at least partially enclosed in a cabinet, chassis, case, or the like. As the electronic device operates, heat is produced by the components of the device and the temperature of the air within the enclosure also increases as a result of the heat generated by the components. With current technology, when the temperature reaches a certain point, actions are taken to actively cool the system. These actions may include activating a fan located near the heat producing component(s) to produce air movement over the component or activating a fan that will force an exchange of air between the outside of the enclosure and the inside of the enclosure. Since the air outside the enclosure is generally cooler than the air inside the enclosure, the net result should be a reduction in the temperature of the air within the enclosure. Unfortunately, as noted above, these fans sometimes fail. The failure of a fan may or may not cause the system to reach a temperature where it automatically shuts down. If the fan failure does cause the system to shut down, the user may be faced with a random failure and a potential loss of data, such as data entered subsequent to the most recent "save" command. If it does not cause the system to shut down, the internal temperature may still cause secondary failures of components. For example, if the system has a hard disk drive, which typically does not generate a significant amount of heat, continued operation of the hard disk drive at high temperatures may cause an early end-of-life for the disk drive motor or the electronics associated with the disk drive.

Thus, there is a need to detect if, after the fan speed has been increased, the fan is actually performing its intended cooling function. A tachometer may have been employed to determine if the fan was operating, but is really only an accurate way to tell if the shaft of the fan is turning, but not if the blades of the fan are turning. However, if the fan blades are slipping on the fan shaft, then the fan isn't effectively moving air, even though the shaft is turning and the tachometer may indicate that the fan is operating properly. Additionally, the tachometer and the associated circuitry used to measure fan shaft speed add cost to the electronic device. Therefore, a system for making sure the fan is actually having the desired cooling effect, and notifying the user when it isn't having the desired cooling effect, is needed.

SUMMARY OF THE INVENTION

Accordingly, the present invention is directed to a system and method for detecting the relative cooling effectiveness of a fan in order to detect a failure of the cooling fan.

In one aspect of the present invention, a fan is disposed in such a way that it pulls air into, or exhausts air out of, an enclosure that houses, for example, an electronic circuit. When the temperature within the enclosure reaches a predetermined value, circuitry within the electronic circuit activates or energizes the fan. A measurement of the increase of temperature is made both before the fan is energized and after the fan is energized. If, after the fan has been energized, the temperature continues to increase at substantially the same rate or trajectory as before the fan is energized, it is determined that the fan is not operating in an effective manner. In some embodiments of the present invention, notification of the fan failure is made. This notification may take the forms of, for example, a message on a display, an indicator being illuminated, or perhaps writing a value to the Desktop Management Interface or other log file so that an administrative entity may see that the fan is not working effectively.

In another aspect of the present invention, a fan is disposed in such a way that it moves air across a heat sink which is thermally coupled to a heat producing component such as, for example, a processor. When the temperature of the heat producing component reaches a predetermined value, circuitry within the electronic circuit energizes the fan. A measurement of the increase of temperature is made before the fan is energized and after the fan is energized. If, after the fan has been energized, the temperature continues to increase at substantially the same rate or trajectory as before the fan was energized, it is determined that the fan is not operating in an effective manner.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
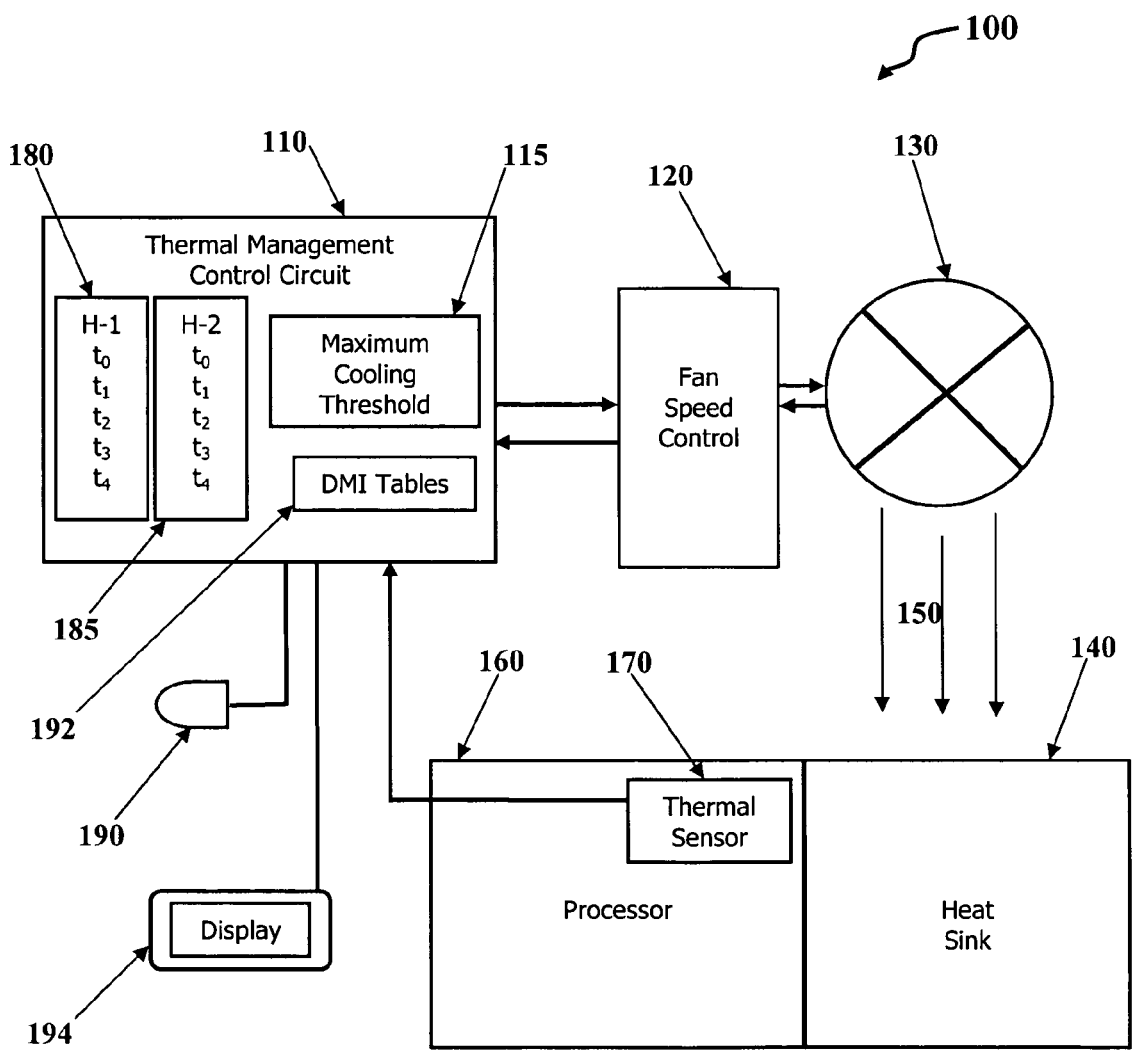
FIG. 1 is a schematic block diagram of an illustrative system implementing the present invention.

Referring generally now to FIG. 1, an illustrative electronic system according to the present invention is shown. The system shown is an example of an electronic device 100 having at least one heat producing electronic component 160, and possibly a heat sink 140 for cooling the component 160, which in this example comprises a processor, but could also comprise another type of component. A thermal sensor 170 may be located internal to the heat producing electronic component 160, mounted near the electronic component, thermally coupled to the electronic component, or thermally attached to the heat sink 140. The heat sink 140 may be coupled to the heat producing electronic component 160 so that heat from the component 160 may be conducted away from the component and transferred to the surrounding air. A fan 130 may be positioned relative to the heat sink 140 such that an air flow 150 produced by the fan 130 contacts the heat sink 140. Optionally, and not necessarily alternatively, the fan 130 may be positioned on the enclosure so that the fan 130 produces a more generalized or indirect air flow. The enclosure may include various air passages, holes, leaks, cracks, or the like to allow air to enter and to exit the enclosure.

A thermal management control circuit 110 monitors the temperature of the heat producing electronic component 160, possibly taking measurements at periodic intervals such as, for example, every 5 seconds (although other relatively shorter or longer periods may be employed). Each temperature measurement may be stored, for example, in a histogram-1 180. The histogram-1 180 may maintain a history of more than one prior n temperature measurements. When the measured temperature exceeds a maximum cooling threshold 115 temperature, the thermal management control circuit 110 may initiate fan operation through a fan speed control 120. The fan speed control 120 provides power to the fan 130, which may be positioned or located so as to blow air 150 over the heat sink 140, though in other embodiments, the fan 130 may exchange outside air with air inside an enclosure in order to cool more than one component of the system. Methods of controlling fan speed are well known in the art and it is believed that virtually any method of fan speed control may be used. For example, the voltage to the fan may be varied, or the pulse width of the power being applied to the fan may be modulated. Methods of determining when to start a fan are well known in the art. There may be several temperature thresholds at which the fan speed is increased incrementally. There may be a degree of hysterisis in the system such that the fan remains at a speed level until the detected temperature falls below the threshold at which operation of the fan was started. This mode of operation would reduce the likelihood of the fan turning on, then after a short period (e.g., a few seconds) turning off, and then, after another short period, turning on again.

Once the fan is started, the thermal management control circuit 110 monitors the temperature of the heat producing component 160, possibly taking measurements at the same periodic intervals as was done before operation of the fan was started. Each measurement is stored in histogram-1 180 maintaining n post-fan operation temperature measurements.

Once n post-fan operation temperature measurements are available, the temperature trajectory of the rate of change of the temperature in the histogram-1 180 is compared to the temperature trajectory of histogram-2 185. If there is little or insignificant difference in the trajectory of both histograms, then the temperature has continued to rise at about the same rate, or in the same trajectory, even though the fan has been started and is operating. Therefore, it may be determined from the lack of change in the histograms that the operation of the fan 130 is not having an observable effect on the temperature of the component 160. In that case, there is a high probability that the fan is not operating, or not operating effectively, and may be disconnected, stuck, slipping, or otherwise is defective in some way. At this time, the user may be warned about the high probability that the fan has failed, or is not effectively cooling, perhaps by energizing an indicator such as an LED 190 (which is preferably a red LED) or by displaying a message on a display 194, or by writing a value to desktop management interface (DMI) table 192. The thermal management control circuit 110 may be comprised of analog and digital logic, or it may be a combination of logic and software. The histogram-180 and the histogram-2 185 may be stored in memory registers, possibly as two arrays of temperatures. The organization of these histograms may be such that after n measurements are stored, upon reading a new measurement, the oldest measurement is deleted from the beginning of the array, the remaining measurements are moved down in the array and the new measurement is added to the end of the array. Various storage formats can be used such as storing the absolute temperature measurement in binary form or storing the difference between one temperature measurement and the next in digital form.

Figure 2:
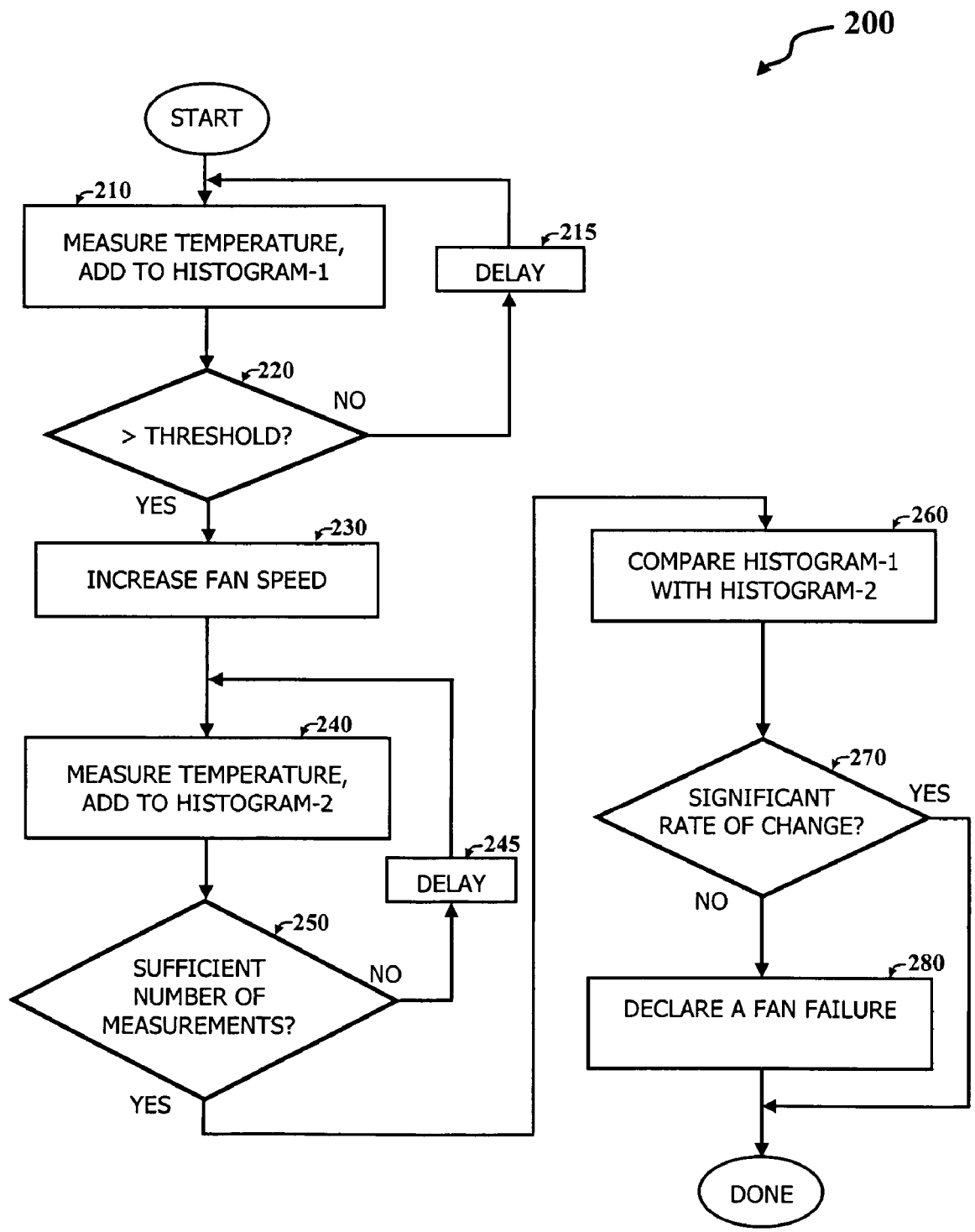
FIG. 2 is a schematic flow chart of the present invention.

Referring now to FIG. 2, a flow chart 200 of the present invention is shown. A temperature is measured and added to the first histogram, histogram-1 180 (step 210). The temperature is compared to the threshold 115 (step 220) to determine if the temperature is getting too high and if cooling is needed. If the temperature does not exceed the threshold, a delay (step 215) may be made, and then the temperature is measure again and added to the histogram (step 210). If the temperature exceeds the threshold, operation of the fan is initiated or the fan operation speed is increased (step 230). Thus, this speed increase may be from off (zero revolutions per minute) to on (something more than zero revolutions per minute), or may simply be an increase of fan speed from a relatively slower speed to a relatively faster speed. In general, the more cooling that is needed, the faster the speed of the fan, but some fans may only have one or two operational speeds. Once operation of the fan is started, another delay (step 235) is taken to allow cooling to start. The delay of step 245 may be similar to or the same as the delay of step 215. Next, another temperature measurement is made (step 240) and added to the second histogram, histogram-2 185. It is then determined if a sufficient number of measurements have been made and stored in histogram-2 (step 250). In one of the simplest embodiments of the present invention, only one measurement would be stored in each of histogram-1 and histogram-2. If there are not a sufficient number of measurements in histogram-2, then steps 235 and 240 may be repeated until there are a sufficient number of measurements, at which time histogram-1 is compared to histogram-2 in step 260. If only one measurement is stored in each of histogram-1 and histogram-2 (n=1), then the two may be numerically compared (step 270) and, if the measurement in histogram-2 is higher than the measurement in histogram-1, perhaps with the addition of an offset quantity, then a significant rate of change will not be detected (step 270) and a fan failure will be detected (step 280). If more than one measurement is stored in each histogram, then each histogram may be smoothed to eliminate outlying measurements and then compared (step 270) to determine if increasing the fan speed had any effect on the rate of temperature increase. If there was a significant rate change, then it is believed that the fan is operational and the flow is done. If there was not a significant rate of change detected, the temperature may have continued to increase at the same rate and slope, and a fan failure may be indicated (step 280). The failure may be declared by turning on a visual indicator, such as the LED 190, displaying a message on the display 194, sending a message to an administrator of computers on a network, and/or making an entry into a Log File, perhaps an entry in a Desktop Management Interface (DMI) table (192).

Figure 3:
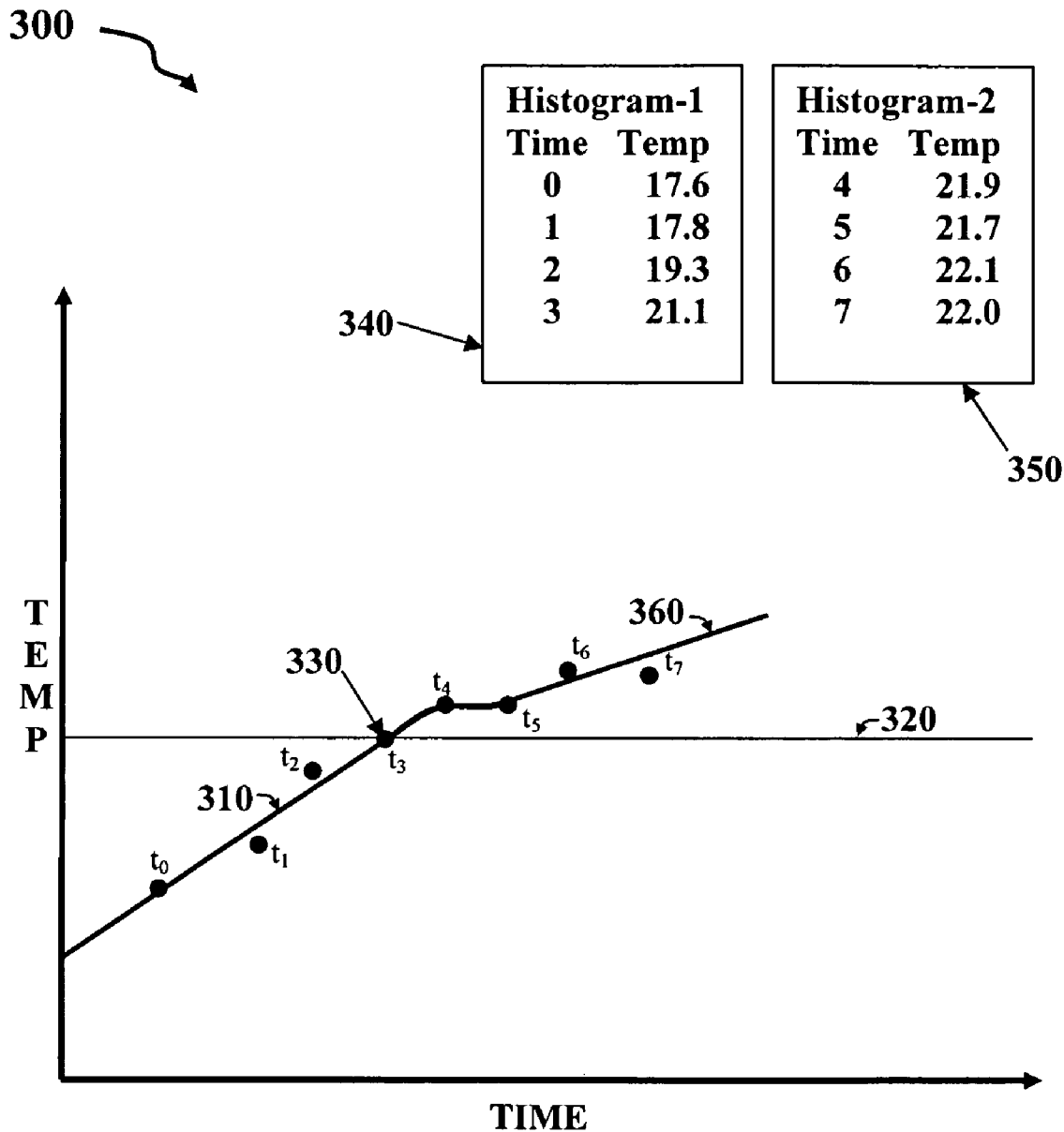
FIG. 3 is a schematic graph of one temperature scenario in which fan operation affects the rate of temperature rise in the electronic component.

Referring now to FIG. 3, a graph 300 of temperatures (versus time) of the present invention is shown. In this example, each histogram of the histogram-1 340 and the histogram-2 350 are configured to store four temperature measurements, e.g., n=4, The temperature plot line 310 is determined by smoothing the four individual temperature measurements $t_0$, $t_1$, $t_2$, and $t_3$ that were taken before the fan was energized. The temperature plot line 360 is determined by smoothing the four individual temperature measurements $t_4$, $t_5$, $t_6$, and $t_7$ that were taken after the fan was energized. In this example, the threshold 320 is at a temperature of 21° C. Since temperature measurement $t_3$ is 21.1° C. and is greater than the threshold 320 temperature measurement, the fan is started or its speed is increased at the time of plot point 330. In this example, since the plot line 360 is sufficiently lower in either slope or value than the plot line 310, it may be assumed that the operation of the fan that began at the time of plot point 330 had an effect on the rate of temperature rise; and therefore the fan may be assumed to be operational.

Figure 4:
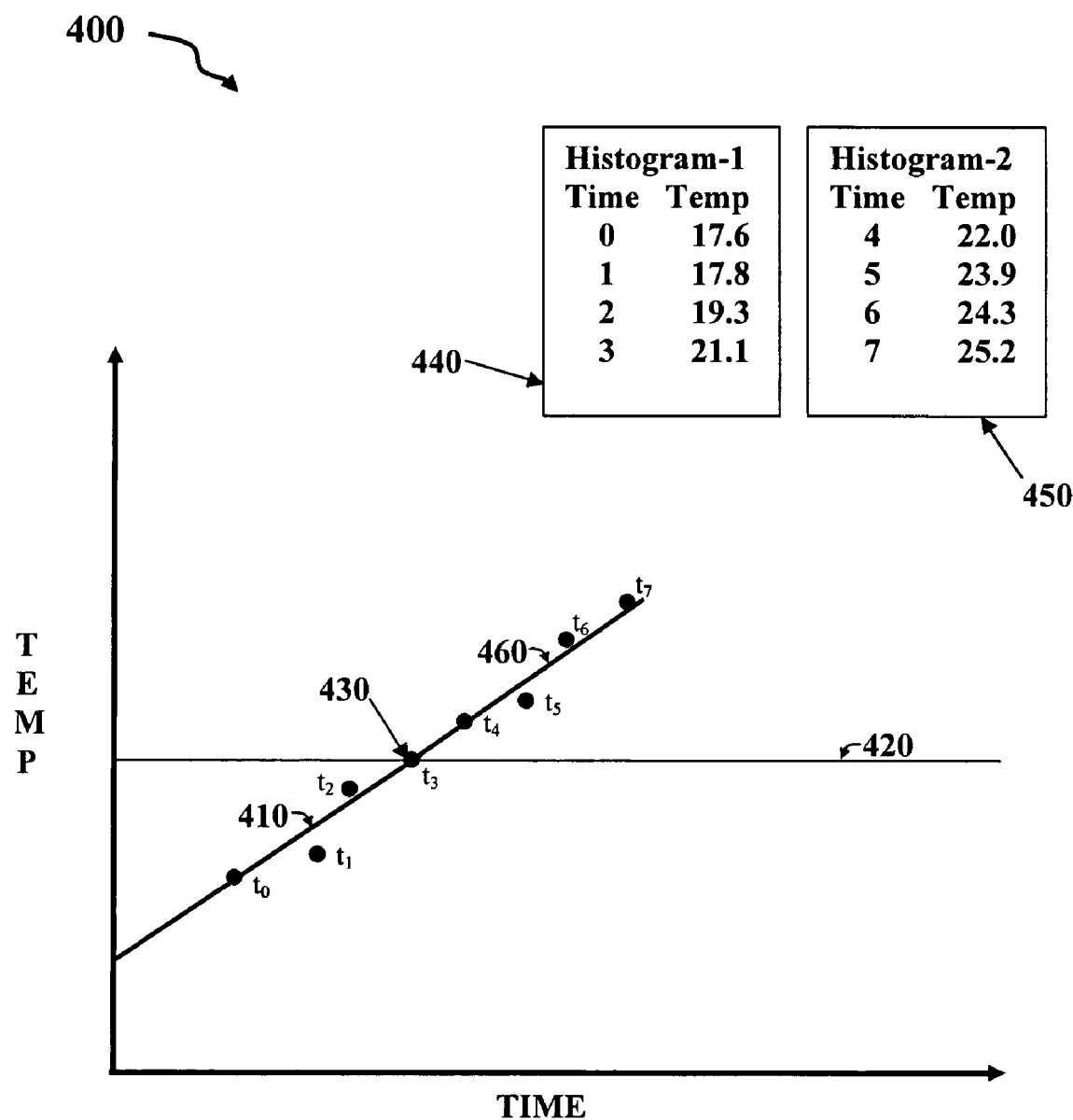
FIG. 4 is a schematic graph of another temperature scenario in which fan operation does not effectively affect the rate of temperature rise in the electronic component.

Referring now to FIG. 4, another graph 400 of temperatures of the present invention is shown. In this example, each histogram of the histogram-1 440 and the histogram-2 450 are configured to store four temperature measurements, e.g., n=4. Temperature plot line 410 is determined by smoothing the four individual temperature measurements $t_0$, $t_1$, $t_2$, and $t_3$ that were taken before the fan was energized. Temperature plot line 460 is determined by smoothing the four individual temperature measurements $t_4$, $t_5$, $t_6$, and $t_7$ that were taken after the fan was energized. In this example, the threshold 420 is at a temperature of 21° C. Since the temperature measurement $t_3$ is 21.1° C. and is greater than the temperature threshold 420, the fan is started or its speed is increased at the time of plot point 430. In this example, since the plot line 460 is substantially similar to either slope or value of the plot line 410, it is assumed that the operation of the fan that began at the time of plot point 430 had little or no effect on the rate of temperature rise, and therefore the fan may be tissumed to not be effectively cooling, either because the fan has not started, or has not increased in speed, or is slipping, and it is likely that the fan is malfunctioning.

Figure 5:
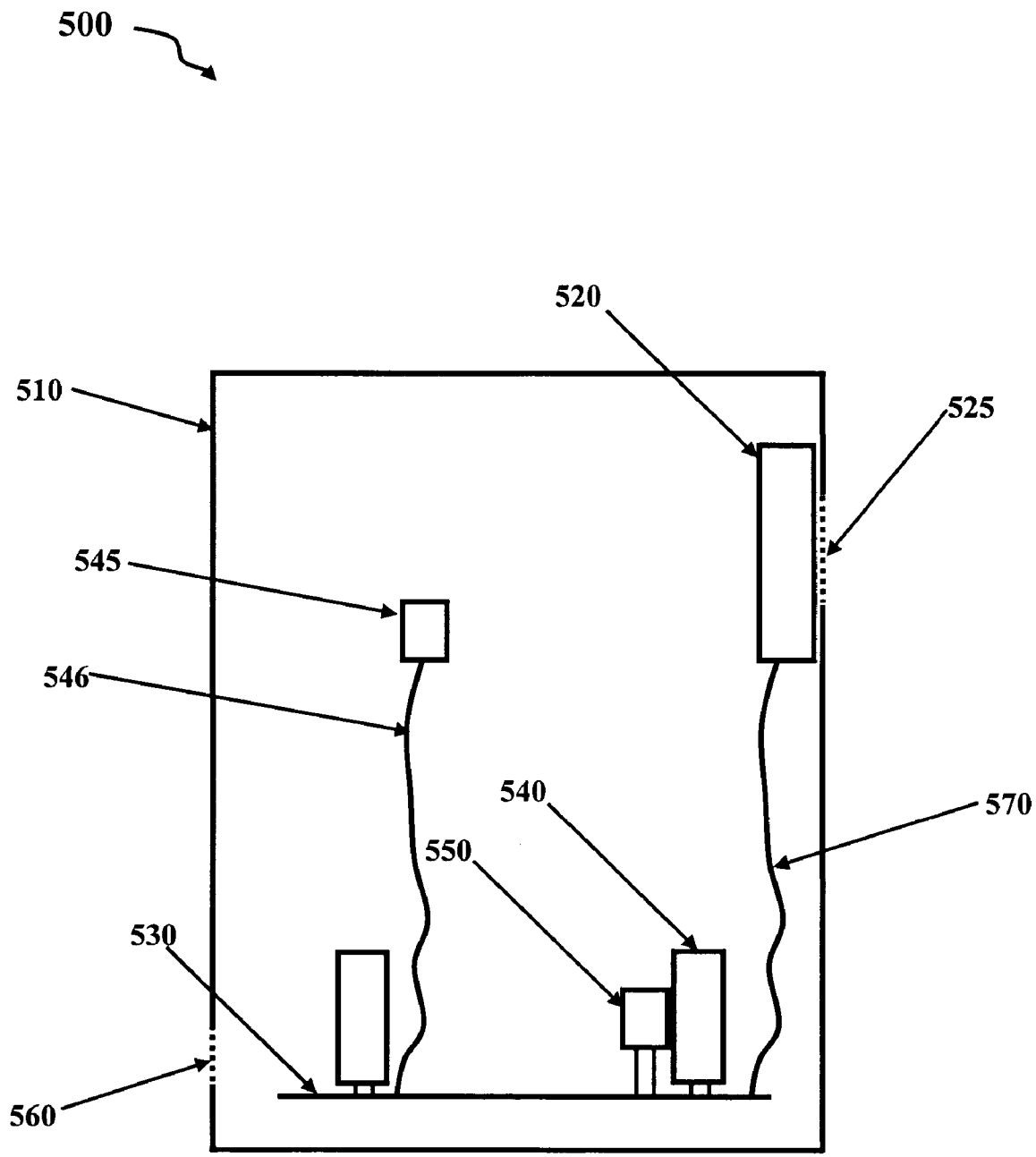
FIG. 5 is a schematic side view of an electronic device according to the present invention and particularly showing an illustrative relationship between the enclosure and the various components of the electronic device.

Referring now to FIG. 5, a view of an electronic device 500 of the present invention is shown. The electronic device may be a computer or any other device cooled by a fan. In FIG. 5, an enclosure 510 houses electronic components mounted upon a printed circuit board 530 or other component support. Also housed in the enclosure 510 is a fan 520. The fan 520 is configured to move air between the inside of the enclosure 510 and the outside of the enclosure 510. The fan 510 forces air to flow into or out of an opening 525 in the enclosure 510. If the fan 520 blows air out of the chassis 510, it is known as an exhaust fan and in that case, cooler air from the outside might enter through spaces or openings in the enclosure 510 such as the opening 560. If the fan 520 blows air into the enclosure 510, then it brings cooler air in and the warmer air escapes through spaces or openings in the enclosure 510 such as the opening 560. In this example, a heat producing component 540 is mounted on the printed circuit board 530. Located in proximity to the heat producing component 540 is a temperature sensor 550. Also in this example, circuitry to monitor the temperature sensed by the temperature sensor 550 and the control fan 520 is also contained on the printed circuit board 530 and connected to the fan 520 by the cable 570. Although one printed circuit board is shown in this example, the present invention is not limited to having any number of printed circuit boards. The electronic device may not have any printed circuit boards and components may be mounted together in other ways or may be mounted on a board and connected to each other with wires. Although, in this example, the temperature sensor 550 is shown touching the component 540, many other configurations are possible without veering from the present invention. In another example, a temperature sensor may be integrated into the component 540. A large variety of processors or CPUs have an integrated temperature sensor used to measure the temperature on the actual die. The temperature sensor may also be located at a distance from the component 540, and may even be located relatively remote from the printed circuit board 530, so as to measure the temperature of the air within the enclosure 510. This is shown by the temperature sensor 545 which is mounted within the chassis 510 to sense the ambient temperature within the chassis and is connected to the printed circuit board 510 by a cable 546.

It is believed that the system and method of the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. An apparatus for determining cooling system effectiveness in an electronic device comprising:

an enclosure for housing an electronic device;
a cooling system connected to said enclosure;
a temperature sensor mounted in said enclosure and configured to measure a series of temperatures in said enclosure; and
a control circuit connected to said temperature sensor and connected to said cooling system and configured to control an amount of cooling provided by said cooling system;
wherein said control circuit is configured to determine a rate of change in the series of temperatures measured by the temperature sensor;
wherein said control circuit is configured to increase the amount of cooling provided by said cooling system in response to said temperature sensor detecting a temperature in excess of a threshold temperature; and
wherein said control circuit is configured to compare a rate of change of the temperature measured before the increase in the amount of cooling provided by the cooling system and a rate of change in the temperature measured after the increase in the amount of cooling, said control circuit being configured to indicate a problem with the cooling system if the rate of change in the temperatures measured after the increase in the amount of cooling continues to increase at a substantially similar rate of change in the temperatures measured before the increase in the amount of cooling provided by the cooling system.

2. The apparatus for determining cooling system effectiveness in an electronic device of claim 1 wherein said electronic device is a computer and said cooling system is a fan.

3. The apparatus for determining cooling system effectiveness in an electronic device of claim 1 further comprising:
a circuit to initiate shutdown of said electronic device when said control circuit indicates said problem with the cooling system.

4. The apparatus for determining cooling system effectiveness in an electronic device of claim 1 wherein said control circuit is configured to indicate said problem with said cooling system by displaying a message on a display.

5. The apparatus for determining cooling system effectiveness in an electronic device of claim 1 wherein said control circuit is configured to indicate said problem with said cooling system by illuminating an indicator.

6. The apparatus for determining cooling system effectiveness in an electronic device of claim 1 wherein said control circuit is configured to indicate said problem with said cooling system by writing a value to a field within a desktop management interface file.

7. A method for detecting the ineffectiveness of a cooling system in an electronic device comprising:
measuring temperatures of an electronic component and determining a first rate of change in the measured temperatures;
determining if a temperature of said electronic component exceeds a predetermined value;
if said temperature exceeds said predetermined value, increasing the cooling of a cooling system configured to cool said electronic component;
measuring temperatures of said electronic component after the increase in cooling of the cooling system and determining a second rate of change in the temperatures measured after the increase; and
if said second rate of change is substantially the same as said first rate of change, determining that operation of said cooling system is ineffective.

8. The method of claim 7 wherein said electronic device is a computer and said cooling system is a fan.

9. The method of claim 7 wherein said electronic component is a processor.

10. The method of claim 7 further comprising:
after said determining that said cooling system is ineffective, indicating a failure.

11. The method of claim 10 wherein said step of indicating comprises displaying a message on a display.

12. The method of claim 10 wherein said step of indicating comprises illuminating an indicator.

13. The method of claim 10 wherein said step of indicating comprises writing a value to a field within a desktop management interface file.

14. A computer comprising:
an enclosure;
a fan mounted in said enclosure;
a temperature sensor for measuring a temperature in said enclosure; and
a control circuit configured to control a speed of said fan, said control circuit being connected to said temperature sensor;
wherein said control circuit is configured to determine a rate of change in the series of temperatures measured by the temperature sensor;

wherein said control circuit is configured to increase the speed of said fan in response to the temperature in said enclosure exceeding a threshold temperature; and wherein said control circuit is configured to compare a rate of change of the temperature measured before the increase in the amount of cooling provided by the cooling system and a rate of change in the temperature measured after the increase in the amount of cooling, said control circuit being configured to indicate a problem with the cooling system if the rate of change in the temperatures measured after the increase in the amount of cooling continues to increase at a substantially similar rate of change in the temperatures measured before the increase in the amount of cooling provided by the cooling system.

15. The computer of claim 14 further comprising:
a circuit configured to initiate shutdown of said computer when said control circuit indicates a fan failure.

16. The computer of claim 14 further comprising:
a circuit configured to indicate said fan failure with a message on a display.

17. The computer of claim 14 further comprising:
a circuit configured to indicate said fan failure by writing a value to a field within a desktop management interface file.

18. The computer of claim 14 further comprising:
a circuit configured to indicate said fan failure by illuminating an indicator.

19. An apparatus for detecting the ineffectiveness of a cooling system in an electronic device, comprising:
cooling means for cooling an electronic component of an electronic device;
temperature sensor means for measuring a first temperature trajectory of said electronic component;
control circuit means for determining if a temperature of said electronic component exceeds a predetermined value, and wherein said control circuit means is configured to determine a rate of change of the first temperature trajectory measured by the temperature sensor means and
if the first temperature trajectory exceeds a predetermined value, initiating an increase in the cooling output of said cooling means for cooling;
said temperature sensor means for further measuring a second temperature trajectory of said electronic component after the initiation of the increase in the cooling output, the first -temperature trajectory being measured by the temperature sensor means for measuring the first temperature trajectory before the initiation of the increase in the cooling output; and
wherein said control circuit means is further configured to compare a rate of chance of the first temperature trajectory measured before the increase in the amount of cooling provided by the cooling means and a rate of change in the second temperature measured after the increase in the amount of cooling, said control circuit means being configured to indicate a problem with the cooling system if the rate of change in the second temperature trajectory measured after the increase in the amount of cooling continues to increase at a substantially similar rate of change in the temperatures measured before the increase in the amount of cooling provided by the cooling means.

* * * * *